(12) United States Patent
Teng et al.

(10) Patent No.: US 7,642,801 B2
(45) Date of Patent: Jan. 5, 2010

(54) CIRCUIT TESTING APPARATUS FOR TESTING A DEVICE UNDER TEST

(75) Inventors: Cheng-Yung Teng, Taipei County (TW); Hung-Wei Chen, Taipei County (TW)

(73) Assignee: Princeton Technology Corporation, Taipei County (TW)

( * ) Notice: Subject to any disclaimer, the term of this patent is extended or adjusted under 35 U.S.C. 154(b) by 0 days.

(21) Appl. No.: 11/898,317

(22) Filed: Sep. 11, 2007

(65) Prior Publication Data

US 2009/0015288 A1    Jan. 15, 2009

(30) Foreign Application Priority Data

Jul. 10, 2007    (TW) ............................... 96211220 U

(51) Int. Cl.
*G01R 31/26*    (2006.01)
(52) U.S. Cl. ...................................... 324/765
(58) Field of Classification Search .................. 324/765
See application file for complete search history.

(56) References Cited

U.S. PATENT DOCUMENTS 3,302,109 A * 1/1967 Jones ......................... 714/736
7,131,046 B2 * 10/2006 Volkerink et al. ........... 714/732

* cited by examiner

*Primary Examiner*—Ha Tran T Nguyen
*Assistant Examiner*—Shaun Campbell
(74) *Attorney, Agent, or Firm*—Muncy, Geissler, Olds & Lowe, PLLC

(57) ABSTRACT

A circuit testing apparatus for testing a device under test is disclosed. The circuit testing apparatus includes a function generator, a signal measuring module and a determining module. The function generator is coupled to the device under test for providing a plurality of testing signals according to a predetermined manner. The signal measuring module is coupled to the device under test and the function module for measuring a plurality of measuring signals generated by the device under test according to the plurality of testing signals and generating a plurality of measuring results according to the predetermined manner. The determining module is coupled to the signal measuring module for determining a testing result for the device under test according to the plurality of measuring results.

8 Claims, 3 Drawing Sheets

CIRCUIT TESTING APPARATUS FOR TESTING A DEVICE UNDER TEST

BACKGROUND OF THE INVENTION

1. Field of the Invention

The invention relates to circuit testing, and more particularly to a circuit testing apparatus for testing a liquid crystal display (LCD) driver.

2. Description of the Related Art

To assure quality of integrated circuits (IC), each IC is tested when manufactured. The manufacturer determines whether an IC is qualified according to a testing result for the IC and whether the IC can be supplied to manufacturers.

General IC testing is achieved using a logic tester. The logic tester can only compare the variation of high level with low level of output voltages of an IC for a pattern function. When an IC providing multiple output voltages is used, for example, an LCD driver, multiple output voltages cannot be tested, such that the IC cannot be tested. Thus, when an LCD driver is tested, a special logic tester for the LCD driver is used for testing.

FIG. 1 is a schematic view of an LCD driver comprising four output voltages. Referring to FIG. 1, an IC under test is a driving circuit of an LCD device, comprising four different output voltages V1, V2, V3, and Vss. Thus, if a pattern function test is implemented to the driving circuit of the LCD, the pattern function must be activated to enable an output pin to output the voltages V1, V2, V3, and Vss, and the driving circuit of the LCD device is measured using the special logic tester, thus determining the function of the driving circuit of the LCD device according to the measuring result and completing the test.

The special tester, which can measure multiple voltage levels at a time, for the driving circuit of the LCD device is different from a general logic tester that can measure multiple output voltages provided by a driving circuit of an LCD device. Testing the driving circuit of the LCD device is completely based on a pass or fail determination of measuring voltages.

A special signal tester for a driving circuit of an LCD device commercially sold costs millions of dollars, such that a test for a special signal tester for a driving circuit of an LCD costs is relatively high, while a cheaper general logic tester cannot achieve required testing. Thus, an improved circuit testing apparatus is desirable.

BRIEF SUMMARY OF THE INVENTION

The invention provides circuit testing apparatuses for testing a device under test (DUT). An exemplary embodiment of a circuit testing apparatus comprises a function generator, a signal measuring module and a determining module. The function generator is coupled to the device under test for providing a plurality of testing signals according to a predetermined manner. The signal measuring module is coupled to the device under test and the function module for measuring a plurality of measuring signals generated by the device under test according to the plurality of testing signals and generating a plurality of measuring results according to the predetermined manner. The determining module is coupled to the signal measuring module for determining a testing result for the device under test according to the plurality of measuring results.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
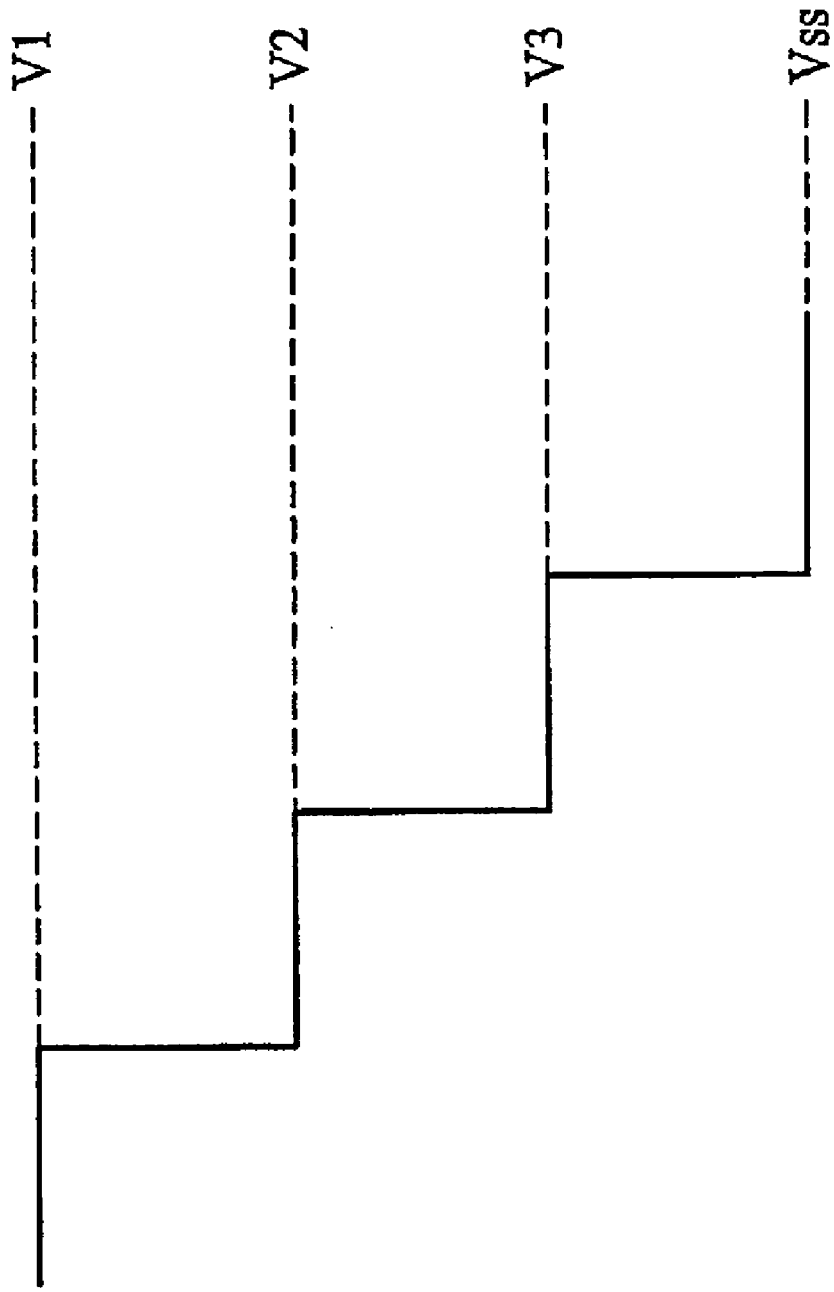
FIG. 1 is a schematic view of an LCD driver comprising four output voltages.

Several exemplary embodiments of the invention are described with reference to FIGS. 2 and 3, which generally relate to circuit testing apparatuses. It is to be understood that the following disclosure provides various different embodiments as examples for implementing different features of the invention. Specific examples of components and arrangements are described in the following to simplify the present disclosure. These are merely examples and are not intended to be limiting. In addition, the present disclosure may repeat reference numerals and/or letters in the various examples. This repetition is for the purpose of simplicity and clarity and does not in itself dictate a relationship between the various described embodiments and/or configurations.

The invention discloses a circuit testing apparatus.

Figure 2:
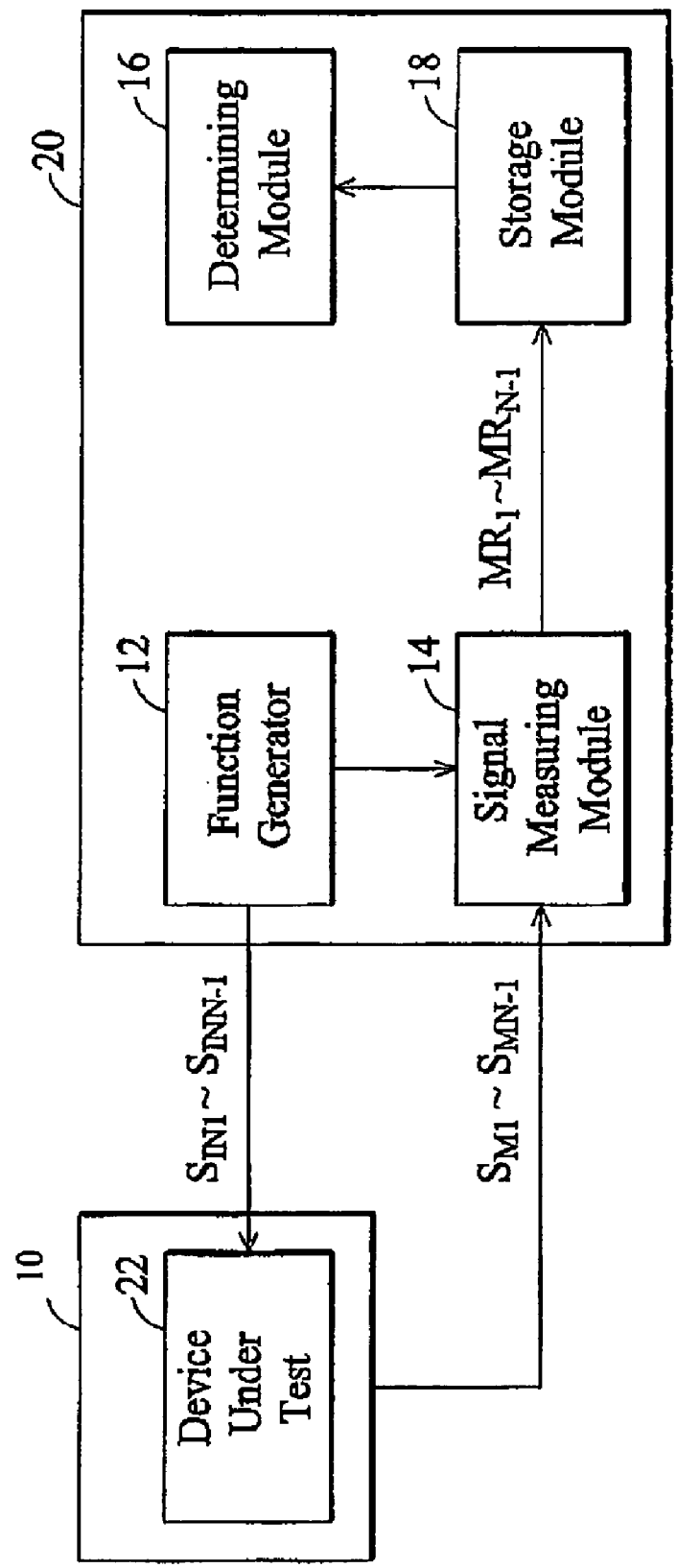
FIG. 2 is a schematic view of an embodiment of a circuit testing apparatus.

FIG. 2 is a schematic view of an embodiment of a circuit testing apparatus.

Referring to FIG. 2, circuit testing apparatus 10 is applied to test a device under test (DUT) 22. Practically, device under test 22 is installed on a DUT board 20 for testing. Circuit testing apparatus 10 comprises a function generator 12, a signal measuring module 14, and a determining module 16. Function generator 12 is coupled to device under test 22 for providing a plurality of testing signals $S_{IN1} \sim S_{INN-1}$, according to a predetermined manner. Signal measuring module 14 is coupled to device under test 22 and function module 12 for measuring a plurality of measuring signals $S_{M1} \sim S_{MN-1}$ generated by device under test 22 according to the testing signals $S_{IN1} \sim S_{INN-1}$ and generating a plurality of measuring results $MR_1 \sim MR_{N-1}$ according to the predetermined manner. Determining module 16 is coupled to signal measuring module 14 for determining a testing result for device under test 22 according to the measuring results $MR_1 \sim MR_{N-1}$. In another embodiment, device under test 10 is a logic tester.

Additionally, device under test 10 further comprises a storage module 18, coupled to signal measuring module 14 and determining module 16, for storing the measuring results $MR_1 \sim MR_{N-1}$ generated by signal measuring module 14. Determining module 16 determines a measuring result of the device under test 22 according to the measuring results $MR_1 \sim MR_{N-1}$ stored in storage module 18. In an embodiment, storage module 18 is a static random access memory (SRAM).

Device under test 22 outputs a plurality of voltage values according to the testing signals $S_{IN1} \sim S_{INN-1}$, and the predetermined manner sequentially assigns two voltage values of the voltage values to a first logic level and a second logic level to generate the testing signals $S_{IN1} \sim S_{INN-1}$.

In an embodiment, the voltage values comprises N voltage values, the testing signals $S_{IN1} \sim S_{INN-1}$ comprises N-1 testing signals, wherein the N-1 testing signal $S_{INN-1}$ indicates the N-1 voltage value is assigned to the first logic level while the N voltage value is assigned to the second logic level, where N is natural number.

Device under test 22 generates two corresponding voltage values of the voltage values according to a testing signal of the testing signals $S_{IN1}$~$S_{INN-1}$, and signal measuring module 14 measures logic levels of the two voltage values to generate the corresponding measuring signals. Signal measuring module 14 measures whether the two voltage values are the first and second logic levels. When the voltage value measured by signal measuring module 14 corresponds to a logic level preset based on $S_{IN1}$~$S_{INN-1}$ generated using the predetermined manner, the output voltage of device under test 22 passes the testing.

Figure 3:
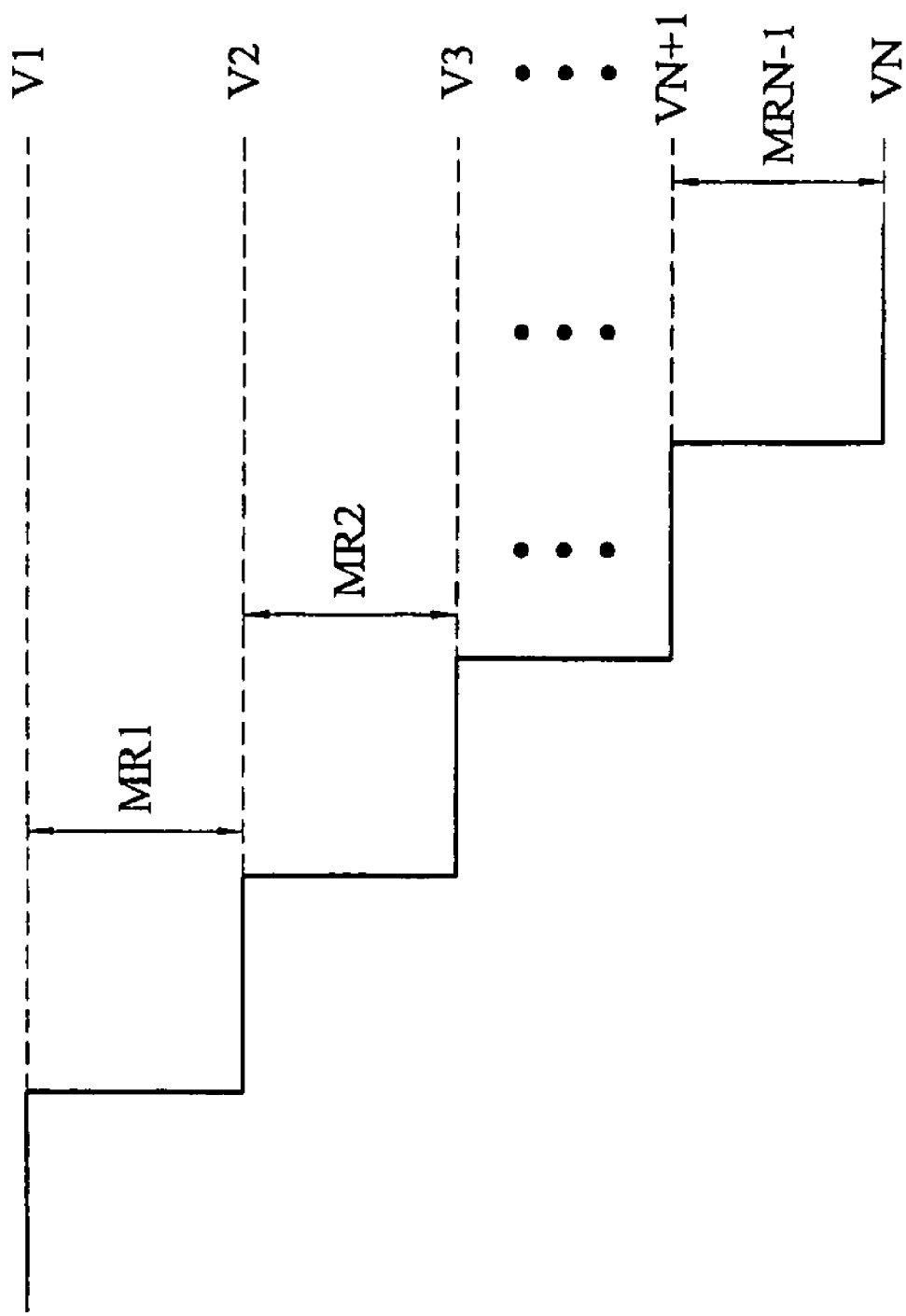
FIG. 3 is a schematic view of an embodiment of a circuit testing apparatus according to a predetermined manner.

FIG. 3 is a schematic view of an embodiment of a circuit testing apparatus according to a predetermined manner.

Referring to FIGS. 2 and 3, the voltage values output by device under test 22 comprising N voltage values V1~VN, where VN is a grounding level Vss and device under test 22 comprises N−1 testing signal $S_{IN1}$~$S_{INN-1}$. The following describes testing operations performed by circuit testing apparatus 10 according to the predetermined manner. The measuring for voltage V1~V2 is first performed. A first output voltage V1 is assigned to a high logic level while a second output voltage V2 is assigned to a low logic level. Next, a first measuring signal $S_{M1}$ is generated and signal measuring module 14 generates and stores a measuring result $MR_1$ in storage module 18. Next, a second measuring is performed. The second output voltage V2 is assigned to the high logic level while a third output voltage V3 is assigned to the low logic level. Similarly, the second measuring result $MR_2$ is output and stored in storage module 18. The described process repeats until the N−1 measuring is performed, assigning the N−1 output voltage VN−1 to the high logic level and the N output voltage VN to the low logic level and obtaining the N−1 measuring result $MR_{N-1}$. Determining module 16 determines the testing result of device under test 22 according to the N−1 measuring result $MR_1$~$MR_{N-1}$.

A conventional logic tester can only measure the high and low logic levels for two output voltages of a device under test at a time but cannot measure multiple output voltages. Thus, an embodiment of a predetermined manner enables a function generator to transmit a plurality of testing signals to a device under test, so multiple output voltages can be tested. A plurality of corresponding testing results are generated and stored in a storage device of a measuring module and a determining module reads the testing results for testing result determination of the device under test, thus completing the test of an IC providing multiple output voltages, saving hardware cost.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A circuit testing apparatus for testing a device under test, comprising:
   a function generator, providing a plurality of testing signals to the device under test according to a predetermined manner;
   a signal measuring module, coupled to the device under test and the function generator, which measures the device under test to obtain a plurality of measuring signals and generates a plurality of measuring results according to the plurality of testing signals and the plurality of measuring signals;
   a storage module, coupled to the signal measuring module, storing the plurality of measuring results; and
   a determining module, coupled to the signal measuring module and the storage module, determining the plurality of measuring results stored in the storage module to provide a testing result,
   wherein the predetermined manner includes sequentially assigning a first logic level and a second logic level to two voltage values from the device under test to generate the testing signals, and
   wherein the predetermined manner includes sequentially assigning a first logic level and a second logic level to every two neighboring voltage values outputted from the device under test, thereby obtaining every one of the testing signals.

2. The circuit testing apparatus as claimed in claim 1, wherein the device under test outputs a plurality of voltage values according to the testing signals.

3. The circuit testing apparatus as claimed in claim 1, wherein the voltage values comprises N voltage values and the testing signals comprise N−1 testing signals, wherein the N−1 testing signal indicates the N−1 voltage value is assigned to the first logic level while the N voltage value is assigned to the second logic level, where N is a natural number.

4. The circuit testing apparatus as claimed in claim 3, wherein the device under test generates two corresponding voltage values of the voltage values according to a testing signal of the testing signals, and the signal measuring module measures logic levels of the two voltage values to generate the measuring signals.

5. The circuit testing apparatus as claimed in claim 4, wherein the signal measuring module measures whether the two voltage values are the first and second logic levels.

6. The circuit testing apparatus as claimed in claim 1, wherein the determining module determines a measuring result of the device under test according to the measuring results stored in the storage module.

7. The circuit testing apparatus as claimed in claim 1, wherein the storage module is a static random access memory (SRAM).

8. The circuit testing apparatus as claimed in claim 1, wherein the circuit testing apparatus is a logic tester.

* * * * *